CONDUCTIVE DEVICES AND METHOD FOR MAKING THE SAME

Filed Aug. 17, 1962

2 Sheets-Sheet 1

INVENTOR.
DANIEL A. WORSHAM
BY
Lippincott, Ralls & Hendricson
ATTORNEYS

INVENTOR.
DANIEL A. WORSHAM
BY
*Lippincott, Ralls & Hendricson*
ATTORNEYS

United States Patent Office 3,268,778
Patented August 23, 1966

3,268,778

CONDUCTIVE DEVICES AND METHOD FOR MAKING THE SAME

Daniel A. Worsham, San Jose, Calif., assignor to Fairchild Camera and Instrument Corporation, Syosset, Long Island, N.Y., a corporation of Delaware Filed Aug. 17, 1962, Ser. No. 217,692
4 Claims. (Cl. 317—234)

This invention relates to new striated electrically conductive devices such as circuit element containers, and a method of making them. In particular, the invention provides smaller semiconductor containers made by the unique sequence of oxidation and reduction steps described below.

The electronics industry makes a wide variety of small, electric circuit elements for a multiplicity of purposes. These circuit elements are placed in a circuit so that their electrodes may contact other circuit elements or connectors. Semiconductor devices are one example of such elements. Size of the circuit elements is extremely critical in spacecraft and missile design, because thousands of these devices are packed into very small areas. Wafers of semiconductor material themselves are extremely minute; however, reliable means for attaching electrodes to these tiny semiconductor wafers has in the past used up considerably more space than the wafers. The thin electrode leads must be rigidly secured, or a slight motion would break them off the wafer. The process of covering the wafer and securing the leads to the cover is called encapsulation. The leads extend through the cover and are rigidly affixed to it where they pass through. By this means they are kept from bending at the fragile points where they contact the semiconductor wafer. The entire semiconductor container is usually many times as large as the wafer itself, yet it contributes nothing to the device's operation.

This invention provides new striated electrically conductive devices which reduce enormously the overall size of circuit elements. In essence, the new devices of the invention have a minimum of three regions: the first is a region of an electrically conductive material which is readily oxidized and forms a strongly adherent, readily reducible oxide; the second is an insulating layer of this oxide formed by oxidizing a layer of the conductive material; and the third is a region of electrically conductive material formed by reducing a layer of the oxide. The three regions adhere very strongly to provide a rugged integral package. The two electrically conductive regions are insulated from each other by the oxide layer. When the device is used as a container for an electric circuit element, two electrodes of the elements are connected electrically with the two electrically conductive regions of the device respectively. When desired, the device may contain a cavity adapted to hold the circuit element. The cavity extends through one of the conductive regions and the oxide region and into the other conductive region. When the circuit element is placed in the container, it makes direct electrical contact with the latter conductive region. The cavity is usually covered; the circuit element may be hermetically sealed inside it, if desired.

Readily oxidized metals which form a strongly adherent, readily reducible oxide include silicon, stainless steel, Kovar [1], nickel, cobalt, tantalum, columbium, and most of the other refractory metals, with nickel, stainless steel, and Kovar being preferred. The selected metal is oxidized by heating it in an oxidizing atmosphere. This atmosphere contains air, oxygen, water vapor, or other well known oxidizing agents. The oxidation time and

[1] Trademark for a nickel-iron alloy of Carborundum Company.

temperature are not critical, and may be chosen by the practitioner according to known principles. The choice usually depends upon the ease of oxidation of the conductive material used, and the oxide thickness required. The oxide layer must be thick enough to leave an insulating oxide layer after a portion of the oxidized layer is reduced to form the second conductive region. Oxidizing temperatures are usually at least about 600° C. to achieve a reasonable rate of oxidation in air.

Reduction is carried out in substantially the same manner as oxidation, except that a reducing atmosphere is used instead of an oxidizing atmosphere—generally hydrogen or other suitable reducing agent is employed. Reduction temperature is chosen by the same principles as oxidation temperatures, with a minimum of about 600° C. again being required to obtain a reasonable reduction rate in hydrogen.

The invention may be better understood by referring to the following more detailed description and the drawings, in which:

FIGS. 1A–C are greatly enlarged, somewhat schematic, transverse sections showing the stepwise process for making devices of an embodiment of the invention;

Figure 1:
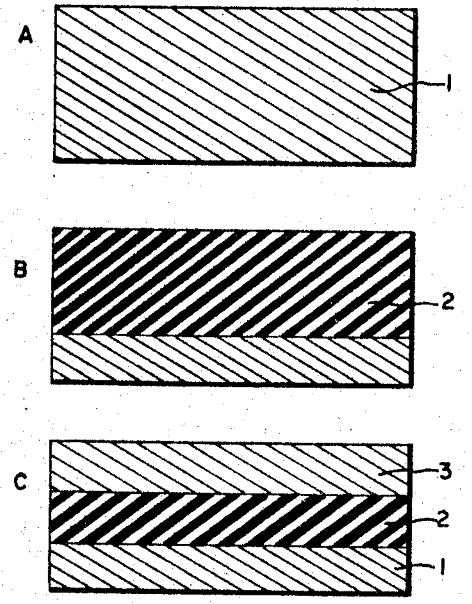
Figure 2:
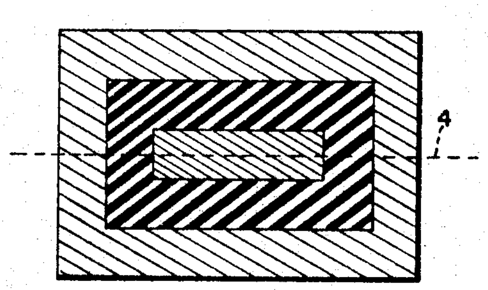
FIG. 2 is a greatly enlarged transverse section showing one way of making the devices of the invention.

Referring to FIG. 1, FIG. 1A shows a block 1 of electrically conductive material which is readily oxidized and has a strongly adherent, readily reducible oxide, e.g., nickel. This block is oxidized to form a layer of oxide 2 shown in FIG. 1B. The surface portion of this oxide layer is subsequently reduced to form a second region of electrically conductive material 3 (FIG. 1C) separated and insulated from the first region 1 by the remainder of oxide layer 2. In practice, oxidation and reduction occur on the entire surface of the block, as shown in FIG. 2. In order to get a block similar to that shown in FIG. 1C, the block of FIG. 2 is cut through its center at the dotted line 4 and the ends are trimmed. If they are not trimmed, the resulting device is that shown in FIG. 3.

Figure 3:
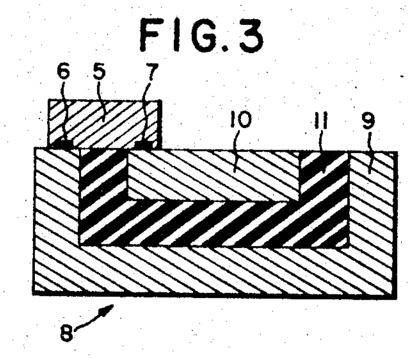
FIG. 3 is a somewhat schematic, greatly enlarged, transverse section illustrating one application of the conductive devices.

Referring to FIG. 3, which shows one application of the conductive device of the invention, an electric circuit element 5 having electrodes 6 and 7 is mounted on conductive device 8, as shown. Electrode 6 is electrically connected to conductive region 9; electrode 7 is electrically connected to conductive region 10; and electrically conductive regions 9 and 10 are separated and insulated from each other by insulating oxide layer 11.

Figure 4:
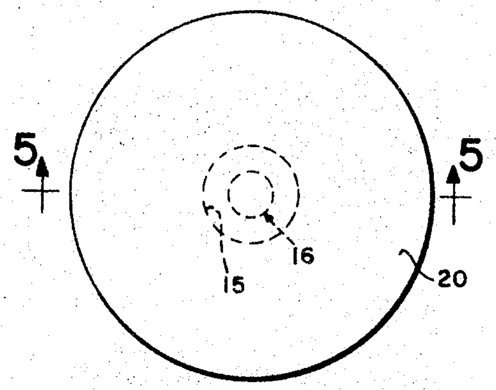
FIG. 4 is a greatly enlarged, somewhat schematic plan view of a device of a preferred embodiment of the invention.
Figure 5:
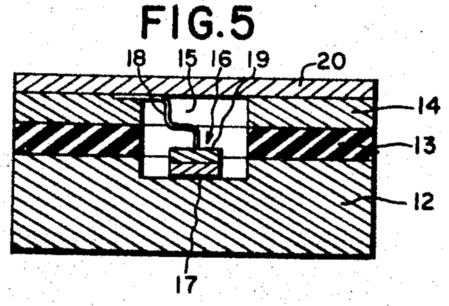
FIG. 5 is a transverse section taken along line 5—5 of FIG. 4.

In one embodiment of the invention having particular application to semiconductors, the electric circuit element is located in a cavity of the device, and may be hermetically sealed inside for protection. This protection may also be afforded by plastic coating on the device itself, when it is not going to be subjected to high temperatures. Referring to FIGS. 4 and 5, the devices shown have a region of electrically conductive material 12, an oxidized layer 13 on its surface, and an electrically conductive region 14 adjacent to oxide layer 13. A cavity 15 is cut or etched through conductive region 14 and oxide layer 13 and into the other conductive region 12. The semiconductor 16 is placed into the cavity. In this embodiment, direct contact is made between conductive region 12 and one surface 17 of the semiconductor. Lead 18 makes contact with another surface 19 of the semiconductor and the other conductive region 14.

When direct contact is to be made between a portion of the circuit element, e.g., silicon, and a conductive portion of the device, various methods may be used. A preferable method employs a silicon-gold eutectic preform. The preform is thermo-compression welded directly to the silicon. The heat causes the metal in the preform to mix with the silicon of the device and therefore make a strong bond between the silicon and the gold. The area of the silicon having the preform attached is placed adjacent to the portion of the conductive material of the conductive device. The conductive material is heated to form an ohmic connection and a strong bond between the semiconductor material and the conductive portion of the container. Generally, a welding temperature of about 380°–400° C. is satisfactory to form this ohmic connection.

Where a circuit element, e.g., a transistor, is connected to the electrically conductive device with leads (preferably gold), instead of a direct contact, another method is used. After the circuit element has been bonded to the electrically conductive device as described above, gold leads are attached between the proper portions of the semiconductor and the conductive device with gold bonds at a temperature of about 350° C. Preferably, both semiconductor and conductive device are first gold-plated at the points where the leads are to be attached. This may be done by welding on gold preforms, or by conventional gold-plating methods known in the art. Although this initial gold-plating step is not absolutely essential to achieve a good bond between the gold leads and the conductive material, experience has shown that a better bond can be achieved in this manner. Gold-plated nickel, for example, provides a completely oxide-free area on which to attach the gold leads. The leads are then thermo-compression-welded to the gold-plated areas of the conductive device and the circuit element.

The semiconductor is then completely encapsulated, and may be hermetically sealed, if desired, by cover 20. The cover may be attached to conductive region 14 in any manner preferred, such as welding. A welded joint provides a strong bond, and therefore a very stable structure. The cover itself may be semiconductive, conductive, or insulating material, as desired, such as metal, plastic (e.g., epoxy), metal oxide, etc. It should be a material which adheres to conductive region 14. Epoxy, for example, may be heated-cured directly on the conductive or insulating material to form a strongly adherent bod. In the embodiment shown, cover 20 also covers lead 18, which is secured as described above to conductive region 14. Alternatively, where cover 20 is conductive, lead 18 may be attached to cover 20. Tabs may be provided for easy contact.

Figure 6:
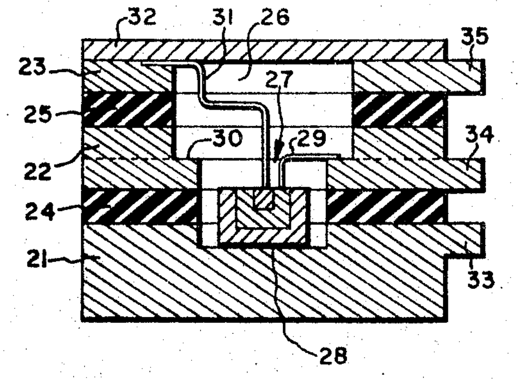
FIG. 6 is a greatly enlarged, somewhat schematic transverse section of another embodiment of the invention.

Another embodiment of the invention is shown in FIG. 6. There a striated structure is shown having electrically conductive regions 21, 22, and 23 separated and insulated from each other by insulating layers 24 and 25. This device is fabricated by making two separate conductive devices and then welding them together. Both devices are formed with two regions of electrically conductive material separated and insulated from each other by a layer of oxide, as discussed above. The first device provides region 21, layer 24, and the lower portion of region 22; region 23, layer 25, and the upper portion of region 22 are provided by the second device. Cavity 26 is cut completely through the second device, and through region 22, layer 24, and part of region 21 of the first device, as shown. The cavity in the upper device is made larger than that in the lower device, to provide a place to connect a lead. The electrical circuit element, such as a transistor 27, is placed in the cavity. Before the two devices are joined, as by welding, bottom portion 28 of the transistor (e.g., the collector) is welded directly to conductive region 21 in the manner described above. Lead 29 is compression-welded to the shelf 30 provided on the lower conductive device. Similarly, lead 31 from the emitter of the transistor is welded to conductive portion 23 on the top surface of the upper conductive device. If desired, a groove may be cut into cover 32 such that an effective hermetic seal between cover 32 and conductive region 23 is not prevented by the lead. The two portions of this electrically conductive device are then joined by welding the upper and lower portions of region 22 together, and cover 32 is attached over region 23 and lead 31. The cover may, if desired, be hermetically sealed on the device for permanent protection of the transistor from dust and dirt. A ball and spring contact may also be used to attach the cover. The completed device is used in an electrical circuit by making electrical contact with regions 21, 22, and 23 at their extended tabs 33, 34, and 35, respectively. Other ways of providing contacts, such as ledges, could be used equally well.

Figure 7:
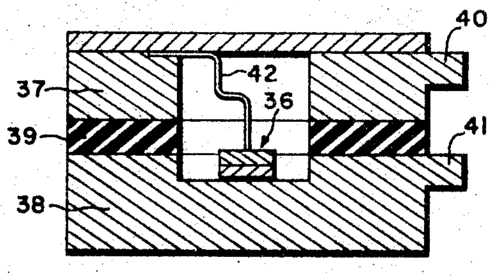
FIG. 7 is a greatly enlarged, somewhat schematic transverse section of an embodiment of the invention having a capacitance connected in parallel with a diode.

By virtue of their structure—electrically conductive material separated by insulating material—the devices of the invention lend themselves exceptionally well to use as capacitors. The oxide center layer forms the dielectric and the two conductive regions form the plates. It is possible, moreover, to deposit conductive leads onto regions of the oxide to achieve a wide variety of printed circuit elements. For example, if the oxide layer is thin enough, the device shown in FIG. 7 provides a capacitor in parallel with a diode. Here diode 36 is connected to regions 37 and 38, which are separated and insulated from each other by a thin oxide layer 39. This layer serves as the dielectric for capacitor with the plates being conductive regions 37 and 38. With tabs 40 and 41 attached to regions 37 and 38, as shown, these tabs are effectively connected to diode 36 in parallel with a capacitor. Where this capacitance is not desired, the oxide layer is made sufficiently thick that the effect of the capacitance may be neglected. It is also possible to insulate lead 42 from conductive region 37 and connect lead 42 and tabs 40 and 41 in a circuit, in order to provide a capacitor in series with a diode.

Figure 8:
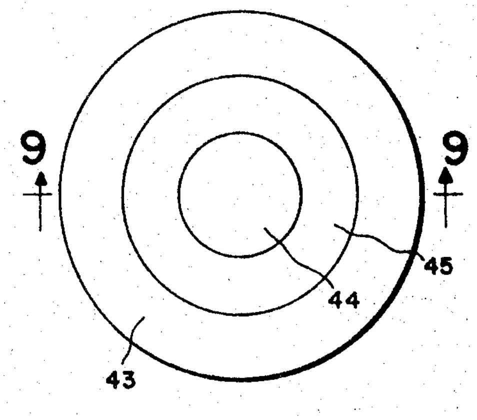
FIG. 8 is a greatly enlarged, somewhat schematic plan view of another application of the invention.
Figure 9:
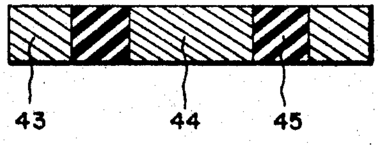
FIG. 9 is a transverse section taken along line 9—9 of FIG. 8.

Another useful application of the invention is shown in FIGS. 8 and 9. This device has two conductive regions, 43 and 44, and an insulating region 45. It can be made in either of two ways. The first method uses a sheet or disk of readily oxidizable material, such as nickel. A mask which is resistant to oxidation is put on the surface of the material and prevents the oxidation of regions 43 and 44 beneath it. The device is then placed in an oxidizing atmosphere to convert the unmasked region 45 from metal to oxide. Upon removal of the masking material, the device shown in FIGS. 8 and 9 is completed. The alternate method of making the device is to start with a sheet of readily reducible metallic oxide. A mask which is resistant to reduction is then placed over region 45, and the device placed in a reducing atmosphere to convert regions 43 and 44 from oxide to metal. Region 44 then provides a lead-through insulated from region 43 by region 45. The conductive device shown in FIGS. 8 and 9 is useful in printed circuits and in integrated semiconductor circuitry. Various specific applications will be apparent to those skilled in the art.

As will also be obvious to one skilled in the art, an almost infinite variety of arrangements could be achieved using the basic concepts of this invention. If the metal used is silicon, a series of layered semiconductor devices may be formed with layers of silicon oxide between them. Combinations of conductor, insulator, and semiconductor are also possible. The only limitations, therefore, to be placed upon the scope of this invention are those in the following claims.

What is claimed is:

1. A method of making an integral, striated container for an electric circuit element having at least two electrodes, which comprises the steps of:

oxidizing a surface of a body of readily oxidizable electrically conductive material having a strongly adherent, readily reducible oxide to form an insulating oxide layer upon said surface, reducing a portion of said insulating oxide layer to form a layer of electrically conductive material separated and insulated from said body by said insulating oxide layer, thereby obtaining a striated structure, forming a cavity in said striated structure, said cavity extending through one of the conductive portions of said structure and through said oxidized layer, disposing an electric circuit element having at least two electrodes in said cavity, and making electrical connection from each of said electrodes to a different one of the conductive layers.

2. An enclosed circuit element comprising:

an integral structure having a plurality of striated layers, the first of said layers being a readily oxidizable, electrically conductive material having a strongly adherent, readily reducible oxide, the second layer adjacent one surface of said first layer being an oxidized layer of said first layer, and the third layer being an electrically conductive layer formed of a reduced portion of said oxidized layer, said integral structure having a cavity formed therein, said cavity extending through one of the conductive portions of said structure and through said oxidized layer, an electric circuit element having at least two electrodes in said cavity, and electrical connections from each of said electrodes to a different one of the conductive layers.

3. The enclosed circuit of claim 2 wherein said element is a transistor.

4. The enclosed circuit of claim 3 wherein the collector of said transistor is disposed in electrical contact with one of said conductive layers at the bottom of said cavity.

References Cited by the Examiner

UNITED STATES PATENTS

| | | | |
|---|---|---|---|
| 1,376,365 | 4/1921 | Wertheimer | 204—143 |
| 1,824,004 | 9/1931 | Allen | 217—238 |
| 2,408,910 | 10/1946 | Burnham | 317—101 |
| 2,874,085 | 2/1959 | Brietzke | 317—101 X |
| 2,879,458 | 3/1959 | Schubert | 317—234 |
| 2,902,628 | 9/1959 | Leno | 29—155.5 |
| 2,956,214 | 10/1960 | Herbst | 317—234 |
| 2,999,964 | 9/1961 | Glickman | 317—234 |

FOREIGN PATENTS

| | | |
|---|---|---|
| 390,346 | 4/1933 | Great Britain. |

OTHER REFERENCES

The Metal Industry, June 18, 1943, pages 386 to 388, an article entitled: Production of Multi-Coloured Effects on Anodised Aluminum.

JOHN W. HUCKERT, *Primary Examiner*.

J. D. KALLAM, *Assistant Examiner*.